United States Patent [19]
Kwong et al.

[11] Patent Number: 6,114,876
[45] Date of Patent: Sep. 5, 2000

[54] TRANSLATOR SWITCH TRANSISTOR WITH OUTPUT VOLTAGE ADJUSTED TO MATCH A REFERENCE BY CONTROLLING GATE AND SUBSTRATE CHARGE PUMPS

[75] Inventors: David Kwong, Fremont; Alex Chi-Ming Hui, Los Altos, both of Calif.

[73] Assignee: Pericom Semiconductor Corp., San Jose, Calif.

[21] Appl. No.: 09/315,775

[22] Filed: May 20, 1999

[51] Int. Cl.[7] .............................................. H03K 19/0175
[52] U.S. Cl. ................................................. 326/81; 326/68
[58] Field of Search .................................. 326/81, 57, 68, 326/80, 62, 83; 327/157, 363, 534

[56] References Cited

U.S. PATENT DOCUMENTS

| | | | |
|---|---|---|---|
| 4,631,421 | 12/1986 | Inoue et al. | 307/297 |
| 5,003,197 | 3/1991 | Nojima et al. | 307/296.2 |
| 5,113,088 | 5/1992 | Yammamoto et al. | 307/296.8 |
| 5,602,500 | 2/1997 | Fournel | 327/77 |
| 5,649,965 | 7/1997 | Pons et al. | 607/2 |
| 5,670,907 | 9/1997 | Gorecki et al. | 327/535 |
| 5,742,195 | 4/1998 | Mizuno et al. | 327/362 |
| 5,751,168 | 5/1998 | Speed, III et al. | 326/83 |
| 5,783,956 | 7/1998 | Ooishi | 327/157 |
| 5,870,573 | 2/1999 | Johnson | 395/311 |
| 6,020,762 | 2/2000 | Wilford | 326/81 |

*Primary Examiner*—David Nelms
*Assistant Examiner*—David Lam
*Attorney, Agent, or Firm*—Stuart T. Auvinen

[57] ABSTRACT

A voltage translator uses an n-channel translator transistor to translate an input voltage at its drain to an output voltage at its source. The gate and substrate of the translator transistor are each biased by charge pumps. A reference transistor is also biased by the charge pumps. A reference input voltage is translated to a reference output voltage by the reference transistor. The reference output voltage is compared to a target output voltage by comparators. When the reference output voltage is below the target, the gate charge pump is turned on, raising the gate voltage to both the reference and translator transistors. The higher gate voltage VGATE raises the output voltage VOUT since VOUT=VGATE−VT for a transistor in saturation. When the reference output voltage is above the target, the substrate charge pump is turned on, pulling the substrate bias voltage below ground. The body effect causes the transistor threshold VT to increase as the substrate is pumped. The higher threshold lowers the output voltage. Once the reference output voltage reaches the target, the charge pumps turn off. The input voltage can toggle high and low since the reference transistor sets the gate and substrate voltages.

20 Claims, 6 Drawing Sheets

VO=VG-VT 3.3V-VT=2.5V

VO=VG-VT 2.6V-VT=1.8V

TRANSLATOR SWITCH TRANSISTOR WITH OUTPUT VOLTAGE ADJUSTED TO MATCH A REFERENCE BY CONTROLLING GATE AND SUBSTRATE CHARGE PUMPS

FIELD OF THE INVENTION

This invention relates to voltage translators, and more particularly to controlling an output voltage using charge pumps.

BACKGROUND OF THE INVENTION

Semiconductor devices are often used in computer and other electronic systems. Older systems often used one basic power-supply voltage, such as 5.0 volts. More recently, lower power-supply voltages such as 3.3 volts have become necessary as semiconductor geometries shrink and applications require lower power drain. As device geometries continue to shrink, lower power-supply voltages are used, such as 2.0 or 1.8 volts.

Many systems use semiconductor integrated circuits (ICs) or chips with several different power-supply voltages, such as 5.0, 3.3, and 1.8 volts. Signals output from a 5.0-volt chip must be reduced in voltage to be input to a 3.3 or 1.8-volt chip. Such voltage translation of output signals is necessary to avoid reading an incorrect logic state, power drain, or latch-up. Furthermore, a 5-volt signal could damage the input thin oxide of a 3.3-volt chip.

Bus switch transistors are often used to connect signals from different chips. Bus switches are semiconductor integrated circuits (IC's) that use metal-oxide semiconductor (MOS) transistors to make or break the connection. Several switches may be combined on a single silicon die. More background on bus switches can be found in "Parallel Micro-Relay Bus Switch for Computer Network Communication with Reduced Crosstalk and Low On-Resistance using Charge Pumps", assigned to Pericom Semiconductor and Hewlett-Packard Company, U.S. Pat. No. 5,808,502. Also see "Bus Switch Having Both P- and N-Channel Transistors for Constant Impedance Using Isolation Circuit for Live-Insertion when Powered Down", U.S. Ser. No. 09/004,929, assigned to Pericom Semiconductor.

FIG. 1A shows a prior-art bus switch device. N-channel transistor 10 connects an input applied to its drain to an output connected to its source. An enable signal is applied to the gate of n-channel transistor 10. This enable signal turns on n-channel transistor 10, connecting the drain to the source. When a low voltage is applied to the enable signal, n-channel transistor 10 turns off, disconnecting the drain and source. This isolates the input from the output.

When the enable or gate voltage is much higher than the source and drain voltages, the output voltage approaches the input voltage so that there is little or no voltage drop across the transistor. However, reduced power-supply voltages make such a gate over-voltage difficult. FIG. 1B shows a bus-switch biased with a 3.3-volt power supply. When the input voltage matches the gate voltage of 3.3 volt, the output (source) voltage is lower than the input voltage by a transistor threshold, Vt. Thus the input voltage of 3.3 volt is reduced by the transistor threshold of about 0.8 volt to produce the output voltage of 2.5 volts. The nominal transistor threshold of 0.7 volt is raised by the body effect when the source is above ground.

Such a voltage drop may be desirable when a 3.3-volt chip is driving a 2.5 volt chip. The bus-switch transistor then acts as a voltage translator, producing a 2.5-volt high signal from a 3.3-volt high signal.

FIG. 1C is an example of voltage translation of a 3.3-volt signal to a 1.8-volt chip. In this example, a 3.3-volt chip sends a signal to a chip with a 1.8-volt power supply. The 3.3-volt input signal must be reduced in voltage to 1.8 volt. Since the maximum output voltage Vout is a threshold below the gate voltage, Vout=Vgate−Vt, or 1.8=Vgate−0.8. Thus the gate voltage Vgate must be 2.6 volts to drop the 3.3-volt input signal to a 1.8-volt output signal.

Generating a 2.6-volt gate voltage is problematic. A voltage divider may be used, but then an additional power drain occurs, and the gate voltage may vary with temperature, process, and supply-voltage variations. Directly inputting a 2.6-volt signal requires an additional output from the system's or PC's power supply, which is undesirable.

Fixed Diode and Transistor Voltage Drops

Voltage drops equal to the transistor threshold voltage may easily be generated, but often the desired voltage is not exactly one threshold below the power-supply voltage. Since the threshold voltage varies with internal voltage due to the body effect, the generated voltage can vary. Temperature, process, and supply-voltage variations can also occur.

Diodes can also be used to reduce voltages. These diodes can be internal or external to the voltage-translator chip. See U.S. Pat. No. 5,751,168 by Speed III et al., and as signed to Texas Instruments. FIG. 2 is a prior-art voltage translator. Diodes 82, 84 are diodes each producing a fixed 0.4-volt drop. Thus the internal power supply 80 is 0.8 volts less than the Vcc power supply. An enable signal ENA is inverted by transistors 86, 88 and again by transistors 92, 94 to drive the gate of voltage-translator transistor 90.

The high gate voltage Vgate of voltage-translator transistor 90 is Vcc-0.4—0.4, or Vcc-0.8. The high input voltage to voltage-translator transistor 90 is reduced by the transistor threshold Vt, so the final output voltage is Vcc-0.8-Vt. When Vcc is 3.3 volts, and Vt is 0.8 volt, the high output voltage is 1.7 volt.

While such diode and threshold-based voltage translators are useful, the final output voltage cannot be an arbitrary value that can be optimized for specific interface requirements. Instead, the output voltage is a multiple of a fixed diode voltage drop and a threshold drop. When another output voltage is desired, such as 1.8 volt rather than 1.7 volt, it cannot easily be obtained. Some conversions, such as from 3.3 volt to 2.0 volt, are difficult to obtain with diodes. Using one diode and the threshold drop with a Vcc of 3.3 volt produces 2.1 volts, not 2.0 volts.

Although these differences in target voltage appear small, extra power can be drawn by the inexact voltages. These differences can actually be much larger as process and operating conditions change. Higher target voltages could damage the lower supply-voltage chips, but a lower target voltage compromises the system noise margin. More precise voltage translation is desirable.

The output voltage is fixed by the configuration of diodes and transistors in the voltage-translator chip. This prevents the user from adjusting the output voltage. Different voltage-translator chips must be used when the different target output voltages are needed. Multiple voltage-translator chips may need to be stocked, increasing costs. As power supply voltages continue to be reduced with succeeding generations of shrinking semiconductor technologies, different voltage-translator chips need to be used.

What is desired is a voltage translator using semiconductor transistors. It is desired to produce any arbitrary output voltage. It is further desired to reduce an input voltage to any desired output voltage using just one n-channel transistor with a carefully-controlled gate voltage. It is desired to eliminate diodes for voltage translation. It is further desired to have a user-programmable output voltage. A single voltage-translator chip is desired than can be used for different, user-programmable output voltages. It is also desired to track temperature, process, and power-supply variations.

SUMMARY OF THE INVENTION

A voltage translator circuit has a signal input with an input voltage and a signal output with an output voltage. A translator transistor is for translating the input voltage to the output voltage. The translator transistor has a gate for controlling conduction from the signal input to the signal output. A reference input voltage is received and a target input with a target output voltage.

A reference transistor translates the reference input voltage to generate a feedback output voltage. The reference transistor has a gate for controlling conduction from the reference input voltage to the feedback output voltage.

A comparator is coupled to the reference transistor. It compares the feedback output voltage to the target output voltage.

A gate charge pump is responsive to the comparator. It raises a gate voltage when the comparator determines that the feedback output voltage is below the target output voltage. The gate voltage from the gate charge pump is applied to the gate of the reference transistor and to the gate of the translator transistor. Thus the feedback output voltage is raised by the gate charge pump when the comparator determines that the feedback output voltage is below the target output voltage.

In further aspects of the invention a substrate pump is responsive to the comparator. It generates a substrate bias voltage. The substrate pump adjusts the substrate bias voltage when the comparator determines that the feedback output voltage is above the target output voltage. A substrate node for the translator transistor and a substrate node for the reference transistor each receive the substrate bias voltage from the substrate pump. Thus the feedback output voltage is lowered by the substrate pump when the comparator determines that the feedback output voltage is above the target output voltage.

The substrate pump reduces the substrate bias voltage to a negative voltage below ground. The negative voltage below ground causes a transistor threshold voltage of the reference transistor and the translator transistor to increase. A higher value of the transistor threshold voltage reduces the feedback output voltage. Thus the substrate pump increases the transistor threshold voltage to reduce the output voltage.

In still further aspects an enable input receives an enable signal. The enable signal indicates an enable mode when the translator transistor is to connect the signal input to the signal output and indicates an isolate mode when the translator transistor is to isolate the signal input from the signal output. A gating means is coupled to the comparator. It de-activates the gate charge pump when the enable signal indicates the isolate mode. Thus the gate charge pump is de-activated by the enable signal during isolate mode.

DETAILED DESCRIPTION

Figure 1A:
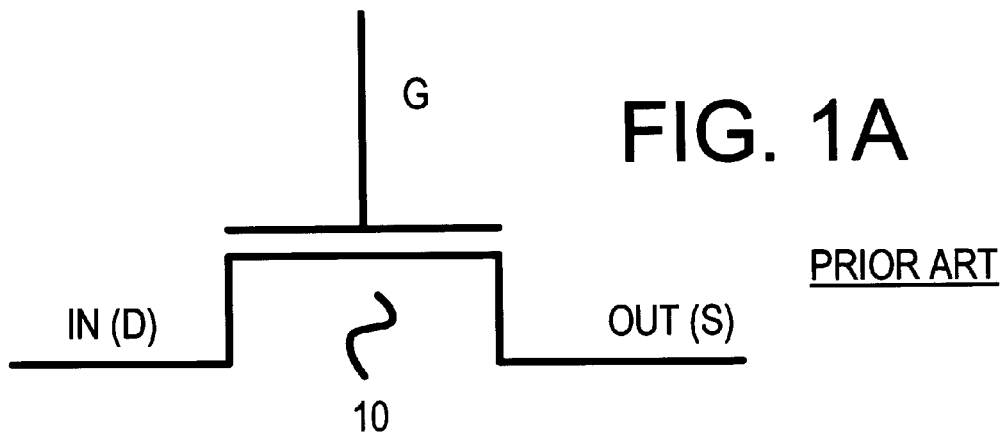
FIG. 1A shows a prior-art bus switch device.
Figure 1B:
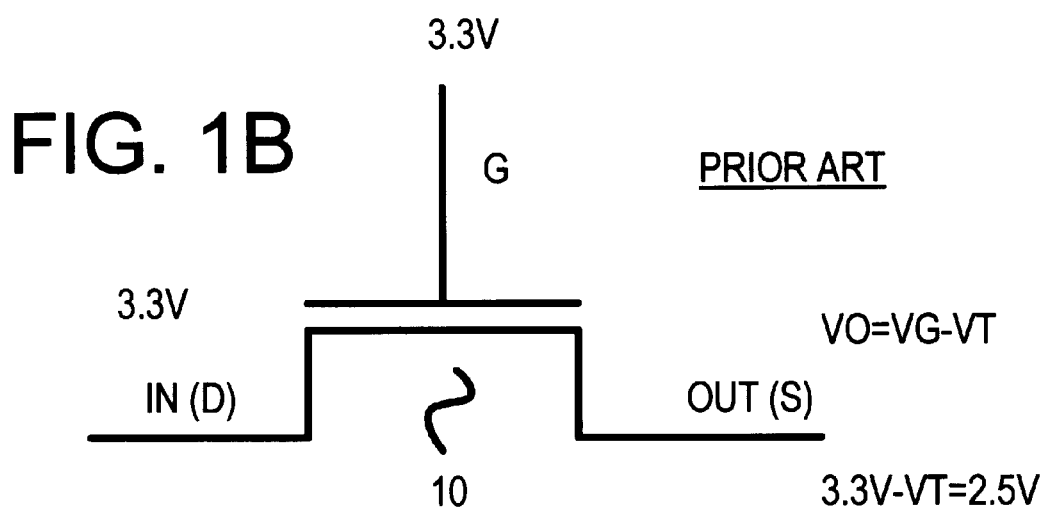
FIG. 1B shows a bus-switch biased with a 3.3-volt power supply.
Figure 1C:
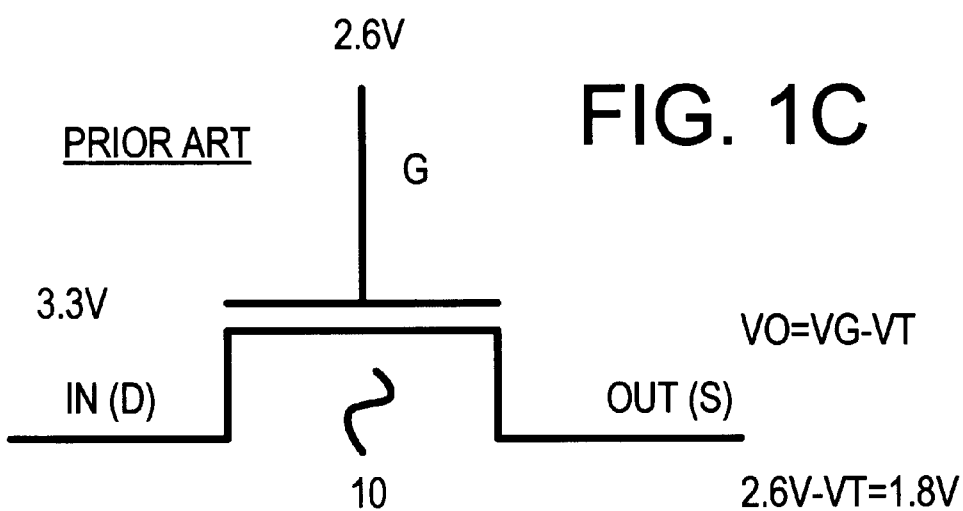
FIG. 1C is an example of voltage translation of a 3.3-volt signal to a 1.8-volt chip.
Figure 2:
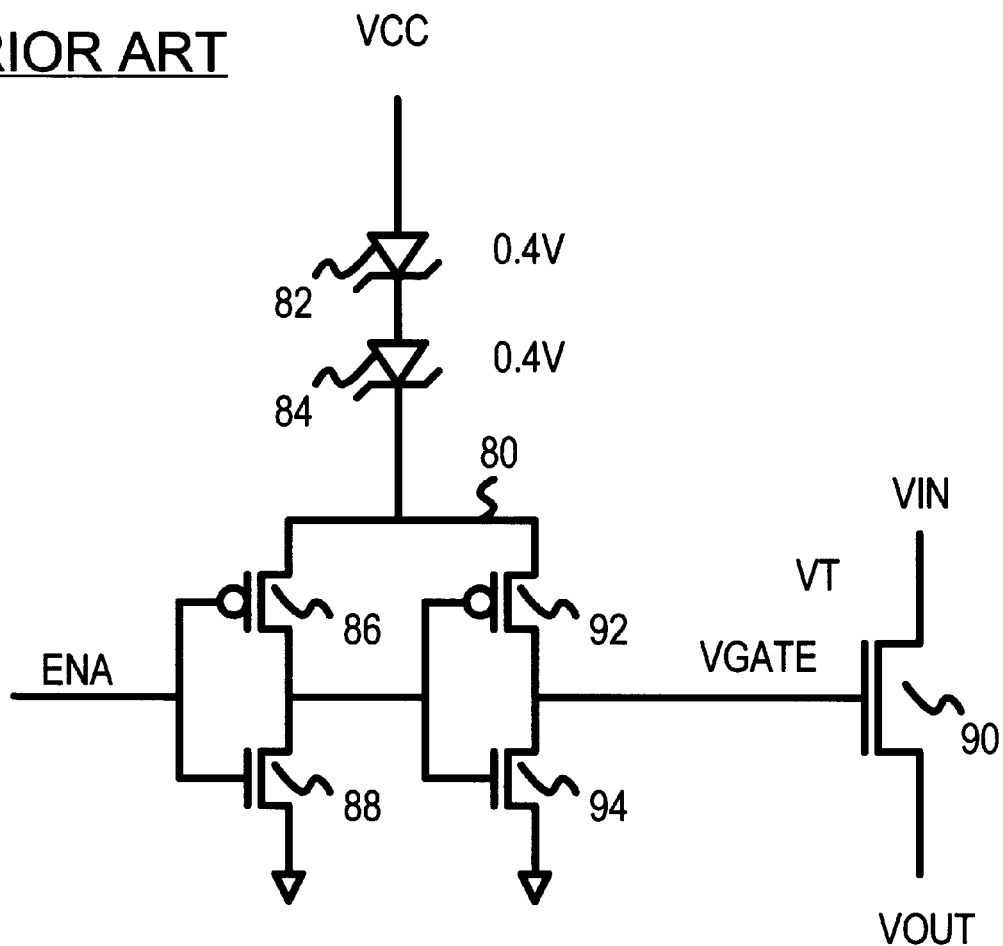
FIG. 2 is a prior-art voltage translator.

The present invention relates to an improvement in voltage translators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a single n-channel transistor can be used to reduce an input voltage to any arbitrary output voltage if the gate voltage is carefully controlled. A reference n-channel transistor can be used to generate a reference output voltage. This reference output voltage can then be compared with a user-programmable target output voltage. The result of this comparison is used to adjust the gate voltage of both n-channel transistors. Thus a feedback loop is employed to control the gate voltage.

The inventors have further realized that a charge pump can be used to generate and control the gate voltage. A charge pump has the advantage that a voltage higher than the power-supply voltage can be generated and applied to the gate. The higher gate voltage can be a threshold above the source and drain voltages, biasing the n-channel transistor into the linear region and reducing the voltage drop through the transistor to zero. Thus the voltage drop through the n-channel transistor can be reduced to zero using the charge pump.

The comparator and feedback can be used to enable the charge pump. The charge pump is then activated to raise the gate voltage and lower the voltage drop until the target output voltage is reached. Then the comparator can disable the charge pump. Thus the voltage drop through the transistor can be carefully controlled by controlling the charge pump.

The output voltage can also be lowered when the reference output voltage is above the user-programmable target output voltage. One way to lower the output voltage is to activate another charge pump that lowers the substrate bias or well voltage. Such a substrate-bias generator can be activated by the comparator when the reference output voltage is too high. The substrate bias generator then lowers the substrate bias voltage. This raises the transistor threshold voltage due to the well-known body effect (Gamma factor). The higher threshold voltage lowers the output voltage.

Thus the output voltage can be adjusted both up and down. The charge pump is activated, raising the gate voltage to raise the output voltage. The substrate bias generator is activated to raise the threshold and lower the output voltage. A feedback loop controls both charge pumps. A reference n-channel transistor is used to generate a reference output voltage that is compared to the user-programmable target output voltage.

Feedback Loop Controls Charge Pumps to Alter Voltage Drop

Figure 3:
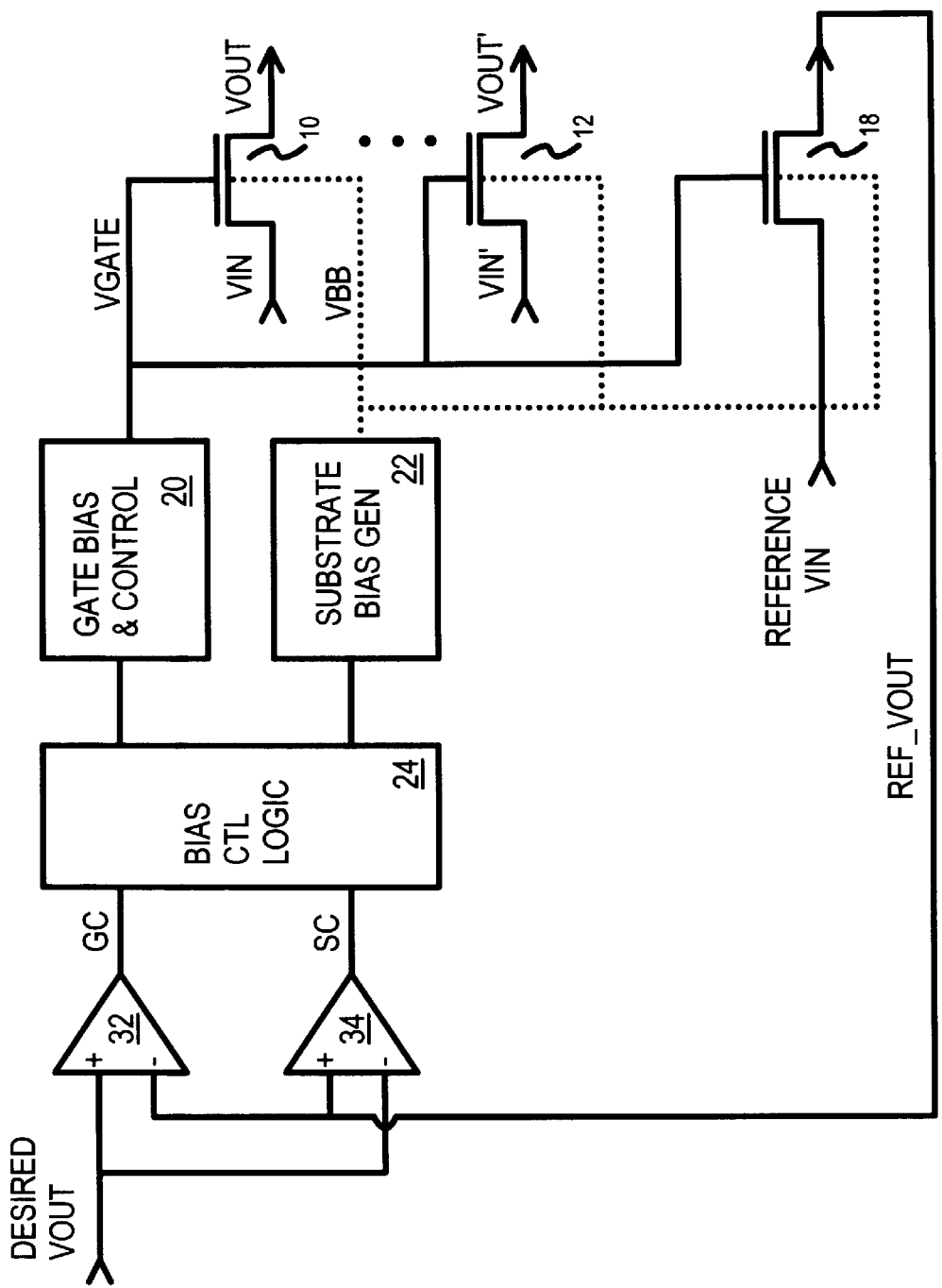
FIG. 3 is a simplified block diagram of a voltage-translator using a feedback loop that controls charge pumps that alter the voltage drop.

FIG. 3 is a simplified block diagram of a voltage-translator using a feedback loop that controls charge pumps that alter the voltage drop. An input voltage VIN is translated to an output voltage VOUT by n-channel transistor 10. N-channel transistor 10 is a large device having a low on resistance, such as a bus-switch transistor. The gate voltage VGATE and the substrate or P-well voltage VBB are carefully controlled to produce the desired voltage drop from VIN to VOUT through transistor 10. Other n-channel transistors 12 may be controlled by VGATE and VBB for voltage-translating other VIN' and VOUT' signals, such as when many signals on a bus are connected in parallel.

Reference transistor 18 is another n-channel transistor that also receives the gate voltage VGATE and substrate bias VBB. reference transistor 18 is preferably the same size and layout as transistor 10, or at least is a scaled version of transistor 10. A reference input voltage REFERENCE_VIN is applied to the drain of reference transistor 18. This reference voltage can be input to the voltage-translator chip as a constant voltage such as from the power supply of an upstream chip that generates VIN to transistors 10, 12.

Reference transistor 18 voltage translates the reference voltage REFERENCE_VIN to produce a reference output voltage REF_VOUT. The reference output voltage REF_VOUT is fed back to the inputs of comparators 32, 34. Comparators 32, 34 compare this feedback reference voltage to a user-programmable target output voltage, which is a desired VOUT. This desired VOUT can be the high or power-supply voltage for the downstream chip that receives VOUT from transistors 10, 12. For example, when signals output from an upstream 3.3-volt chip are to be translated to inputs to a downstream 2.0-volt chip, a 3.3-volt power-supply voltage is applied as REFERENCE_VIN, while the 2.0-volt power-supply voltage is applied as the DESIRED_VOUT.

Comparator 32 compares the feedback REF_VOUT to the DESIRED_VOUT and activates a gate-pump control signal GC when the feedback REF_VOUT is lower than the DESIRED_VOUT. The GC signal then causes bias control logic 24 to turn on the oscillator to the gate charge pump in gate bias control 20. Gate bias control 20 then raises the gate voltage VGATE.

As VGATE is pumped higher in voltage, VOUT and REF_VOUT rise, since VOUT=VGATE−VT for a high VIN when transistor 10 is saturated. Once REF_VOUT rises to match DESIRED_VOUT, comparator 32 deactivates the gate-pump control signal GC. Bias control logic 24 then disables the charge pump oscillator, and gate bias control 20 keeps the gate voltage VGATE constant.

Comparator 34 compares the feedback REF_VOUT to the DESIRED_VOUT and activates a substrate-pump control signal SC when the feedback REF_VOUT is higher than the DESIRED_VOUT. The SC signal then causes bias control logic 24 to turn on the oscillator to the substrate charge pump in substrate bias generator 22. Substrate bias generator 22 then lowers the substrate bias voltage VBB.

As VBB is pumped lower (more negative) in voltage, the body effect causes the n-channel transistor threshold voltage VT to rise. VOUT and REF_VOUT fall, since VOUT= VGATE−VT for a high VIN when transistor 10 is saturated. Once REF_VOUT falls enough to match DESIRED_VOUT, comparator 34 deactivates the substrate-pump control signal SC. Bias control logic 24 then disables the substrate charge pump oscillator, and substrate bias generator 22 keeps the substrate voltage VBB constant.

Figure 4:
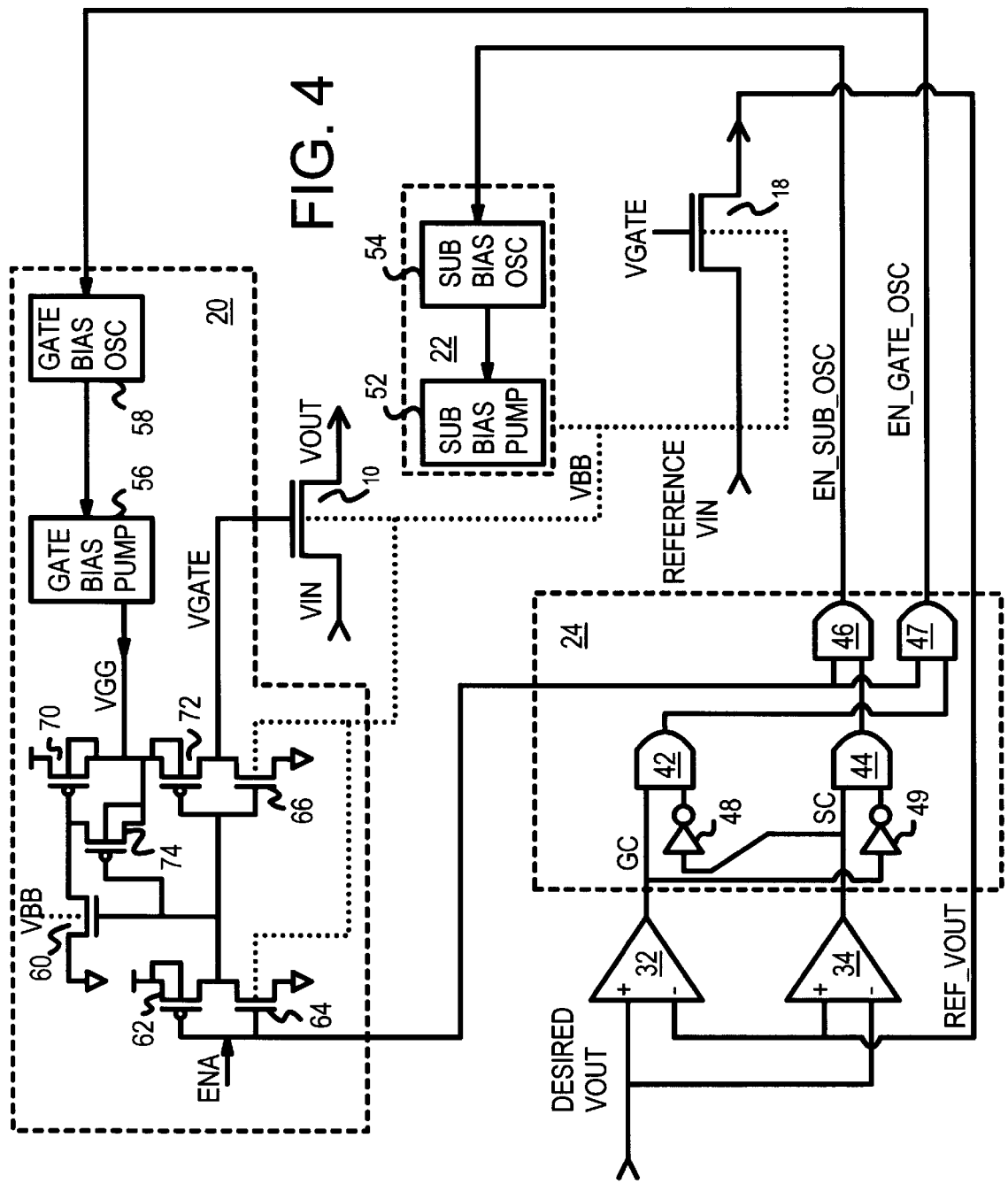
FIG. 4 is a more detailed schematic of a voltage translator using charge pumps and feedback.

Detailed Schematic—FIG. 4

FIG. 4 is a more detailed schematic of a voltage translator using charge pumps and feedback. An input voltage VIN is translated to output voltage VOUT by n-channel transistor 10. When the input voltage is high, the output voltage VOUT can be increased until it equals VIN as the gate voltage VGATE is raised. The output voltage VOUT can be lowered by increasing the substrate bias VBB under transistor 10, thus increasing its threshold voltage VT. Under saturated conditions when VIN is high, VOUT=VGATE−VT.

A feedback loop controls VGATE and VBB. Reference n-channel transistor 18 also has VGATE applied to its gate and VBB applied to its substrate. A reference input voltage REFERENCE_VIN is applied to the drain of reference transistor 18. The voltage drop through reference transistor 18 is about the same as the voltage drop in transistor 10 from VIN to VOUT. Thus the reference output voltage REF_VOUT matches VOUT when REFERENCE_VIN is the same voltage as VIN when VIN is in its high state.

The reference output REF_VOUT is fed back to comparators 32, 34, which compare the feedback reference voltage to the desired VOUT, which is a user-programmable target output voltage that the user applies to an input of the integrated circuit. Comparator 32 has the reference VOUT applied to its inverting input while comparator 34 has REF_VOUT applied to its non-inverting input. Thus the inputs for comparators 32, 34 are reversed. Comparator 32 activates its output GC when REF_VOUT is lower than the target, while comparator 34 activates its output SC when REF_VOUT is above the target voltage.

Comparator 32 activates its output GC to activate the gate charge pump, while comparator 34 activates its SC output to activate the substrate charge pump. Bias control logic 24 receives signals GC and SC from comparators 32, 34 and generates gate charge-pump enable EN_GATE_OSC and substrate charge-pump enable EN_SUB_OSC. AND gates 42, 44 and inverters 48, 49 ensures that only one of signals GC, SC are active. If both are active, neither charge pump is activated since some sort of error is occurring.

AND gates 46, 47 block signals SC or GC from turning on charge pumps oscillators 54, 58 when transistor 10 is not enabled. Enable ENA is an input to the voltage-translator chip. When ENA is low, the gate voltage VGATE should be driven to ground to isolate the source from the drain of transistor 10, disconnecting VIN from VOUT. When ENA is high, transistor 10 is turned on, connecting its source and drain. Then VIN can be voltage-translated to VOUT.

When SC but not GC is active, AND gate 44 drives a high to AND gate 46. When the gate of transistor 10 is enabled by input ENA, AND gate 46 activates substrate charge-pump enable EN_SUB_OSC. This activates substrate charge pump oscillator 54, which pumps a capacitor in substrate bias pump 52, causing substrate voltage VBB to fall below ground. Thus substrate bias generator 22 lowers substrate voltage VBB. This raises the threshold voltage VT, causing VOUT and REF_VOUT to fall. Eventually, REF_VOUT falls enough so that it matches the target voltage DESIRED_VOUT, and comparator 34 disables signal SC, shutting off substrate charge-pump oscillator 54. This keeps VBB at a constant voltage. Should transistor 10 remain enabled for a very long time so that substrate leakage allows VBB to rise, comparator 34 again activates signal SC to lower VBB until the leakage is compensated for.

When GC but not SC is active, AND gate 42 drives a high to AND gate 47. When the gate of transistor 10 is enabled by input ENA, AND gate 47 activates gate charge-pump enable EN_GATE_OSC. This activates gate charge pump oscillator 58, which pumps a capacitor in gate bias pump 56, causing pumped voltage VGG to rise. Gate bias control 20 raises gate voltage VGATE as a result.

When ENA is high, n-channel transistor 64 drives a low to the gate of p-channel transistor 72, turning it on and turning n-channel transistor 66 off. P-channel transistor 72 then connects the pumped voltage VGG from gate charge pump 56 to the gates of transistors 10, 18 as voltage VGATE. P-channel transistor 74 is also turned on, driving a high voltage to the gate of p-channel supply transistor 70. This turns p-channel supply transistor 70 off.

The well tap of p-channel transistors 70, 72, 74 are connected to VGG rather than to power-supply voltage so that they remain fully on or off when VGG is above the power-supply voltage.

When ENA is low, p-channel transistor 62 drives a high voltage to the gates of p-channel transistors 72, 74, turning them off. VGATE is driven low to ground by n-channel transistor 66. This disables transistors 10, 18. N-channel transistor 60 turns on, driving a low voltage to the gate of p-channel supply transistor 70, which drives VGG to the power-supply voltage. This pre-charges VGG and primes the charge pump for the next time ENA is activated.

Charge pump oscillators 54, 58 can be standard ring oscillators, which have an odd number of inverting stages. The oscillator can be turned off by disconnecting the power supply to one or more of the stages in the ring. Charge pumps 52, 56 can be standard charge pumps that connect the output of the oscillator to one side of a capacitor, and the other side of the capacitor to a diode network that allows charge to move in one direction only. The capacitor pumps charge through the diode network to raise VGG above the power supply voltage or lower VBB below ground. Many variations to the charge pumps and their oscillators can be made.

Figure 5:
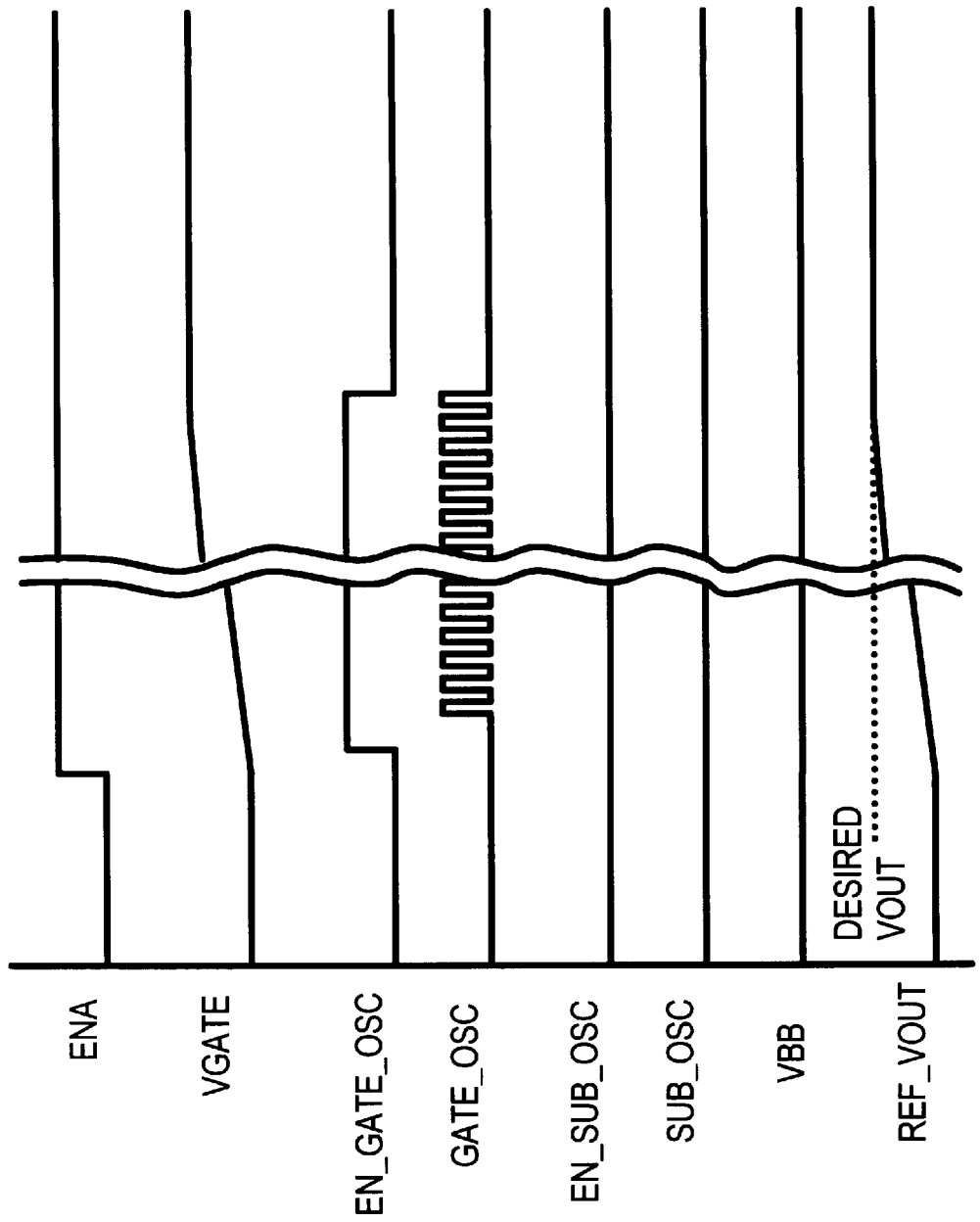
FIG. 5 is a waveform of the voltage translator when the gate voltage is raised by the charge pump to increase the output voltage VOUT.

Gate Pumping to Raise VOUT—FIG. 5

FIG. 5 is a waveform of the voltage translator when the gate voltage is raised by the charge pump to increase the output voltage VOUT. When the voltage translator is enabled by ENA rising, and the reference output voltage REF_VOUT is lower than the desired VOUT, the gate oscillator is enabled by EN_GATE_OSC going high. The gate oscillator pulses high and low for some time. The gate voltage VGATE is slowly pumped up, causing REF_VOUT to rise. Since the substrate oscillator is not turned on, VBB remains constant.

After some period of time, VOUT and REF_VOUT reach the target output voltage, DESIRED_VOUT. Then the comparator deactivates EN_GATE_OSC and the gate charge-pump oscillator stops pulsing. VGATE is then set at a sufficiently high voltage so that the desired VOUT is produced. VGATE and REF_VOUT then remain constant in voltage. The input VIN can switch low and high, causing VOUT to switch high and low. However, REF_VOUT remains high and the oscillator does not have to turn on again.

Figure 6:
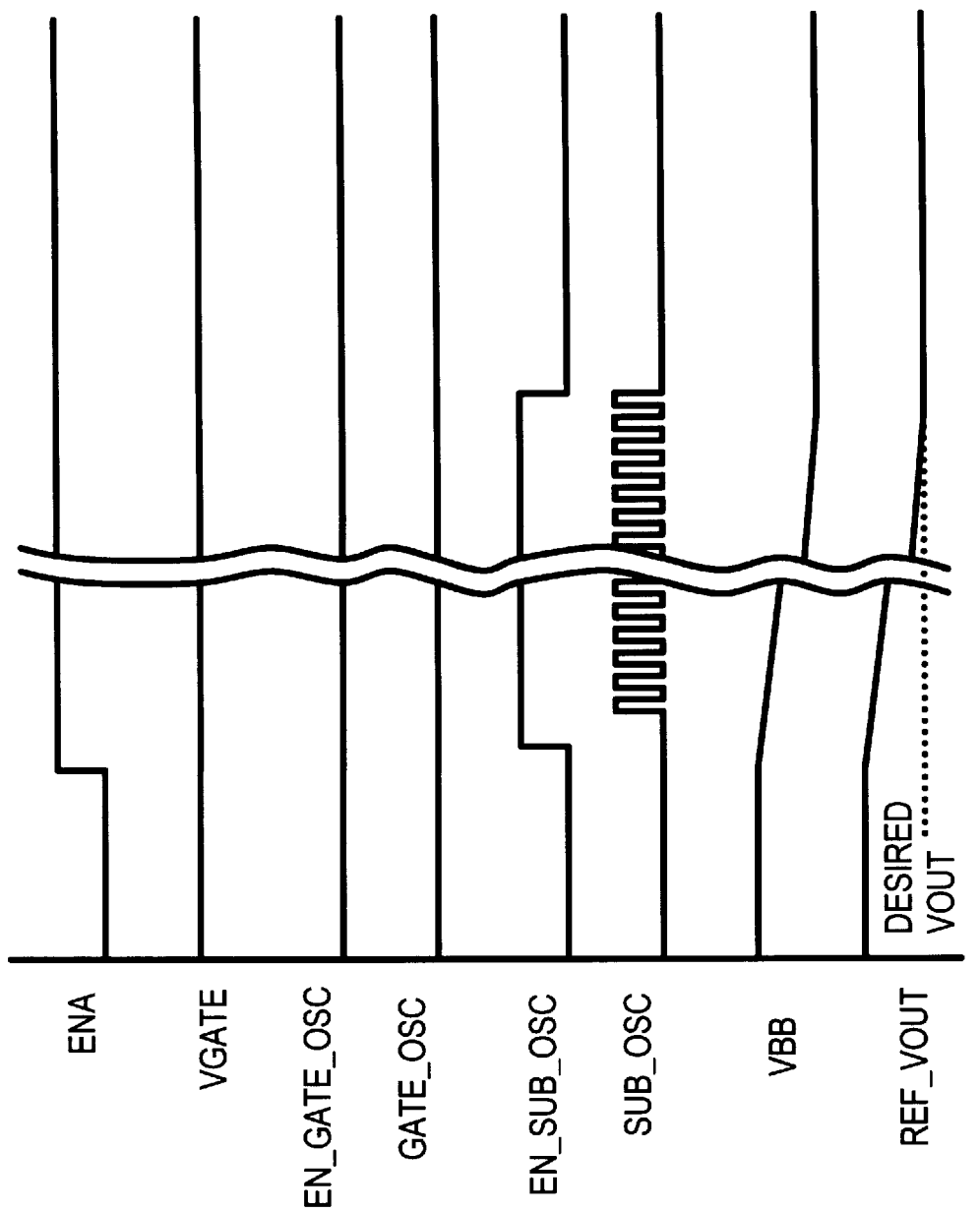
FIG. 6 is a waveform of the voltage translator when the substrate voltage is lowered by the charge pump to decrease the output voltage VOUT.

Substrate Pumping to Lower VOUT—FIG. 6

FIG. 6 is a waveform of the voltage translator when the substrate voltage is lowered by the charge pump to decrease the output voltage VOUT. When the voltage translator is enabled by ENA rising, and the reference output voltage REF_VOUT is higher than the desired VOUT, the substrate oscillator is enabled by EN_SUB_OSC going high. The substrate oscillator pulses high and low for some time. The substrate voltage VBB is slowly pumped down, causing REF_VOUT to fall. Since the gate oscillator is not turned on, VGATE remains constant.

After some period of time, VOUT and REF_VOUT reach the target output voltage, DESIRED_VOUT. Then the comparator deactivates EN_SUB_OSC and the substrate charge-pump oscillator stops pulsing. VBB is then set at a sufficiently negative voltage so that the desired VOUT is produced. VBB and REF_VOUT then remain constant in voltage. The input VIN can switch low and high, causing VOUT to switch high and low. However, REF_VOUT remains high and the oscillator does not have to turn on again.

Advantages of the Invention

The voltage translator uses semiconductor transistors and is easy to integrate with other devices. It can easily be manufactured with standard CMOS processes without additional process steps.

Any arbitrary output voltage can be produced. The output voltage is not limited to discrete voltage steps of diodes and transistors. The exact output voltage can be tuned for the application at the last minute by the systems designer. An input voltage can be reduced to any desired output voltage using just one n-channel transistor in the speed path. This transistor has a low ON resistance and thus adds minimal delay to critical paths in a network or computer.

The body effect varies with VBB in a non-linear manner. The exact function is not critical since the comparator compares the final result—the output voltage. The substrate can be pumped down to a VBB of −3 or more volts, which increases the threshold VT by 1–2 volts. When the input VIN is 3.3 volts, the output can be any voltage from 3.3 to 1 volt. Output voltages from about 2.3 to 3.3 volts require that VGATE be pumped up, while voltages below about 2.3 v use the substrate pump to increase the threshold.

The invention carefully controls the gate voltage using a charge pump. Diodes for voltage translation are eliminated, as are current-drawing voltage dividers. The output voltage is user-programmable. The user merely has to input the desired output voltage to the voltage-translator chip as a target voltage. A single voltage-translator chip can be used for different, user-programmable output voltages.

The feedback loop tracks temperature, process, and power-supply variations since a reference transistor is used. The actual input voltage VIN can pulse high and low without affecting the voltage tracking since the reference transistor has its input kept high. Many transistors can be integrated on the same chip so that a parallel path is provided with voltage translation.

Alternate Embodiments

Several other embodiments are contemplated by the inventors. For example, p and n-channel devices and wells can be reversed. Other kinds of charge pumps and devices can be substituted or added. Multi-stage charge pumps can be used, as can several oscillators. With additional logic and modifications, two separate charge pumps can be merged into one. Other technologies besides complementary metal-oxide-semiconductor (CMOS) may be used in the future. Power supply voltages are expected to continue to drop with newer technologies.

The user programmable target output voltage (the desired output) can be derived from an on-chip reference (such as a band-gap reference) if desired. In another embodiment, only the substrate bias control is used to regulated the lower target output voltage when only lower translated output voltages are needed.

The invention has been explained in terms of a voltage drop for high signals. Of course, low voltages may also be applied as input voltages VIN. These low voltages are simply passed through, often without a voltage drop. Thus dynamic signals can be applied to the VIN inputs of the voltage translator. When the VIN signal is low, VOUT is also low. Often the low is ground, so that both VIN and VOUT are at ground. When the VIN signal switches to a high voltage, then the high voltage is reduced from VIN to VOUT.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A voltage translator circuit comprising:
   a signal input having an input voltage;
   a signal output having an output voltage;
   a translator transistor, for translating the input voltage to the output voltage, the translator transistor having a gate for controlling conduction from the signal input to the signal output;
   a reference input voltage;
   a target input for inputting a target output voltage;
   a reference transistor, for translating the reference input voltage to generate a feedback output voltage, the reference transistor having a gate for controlling conduction from the reference input voltage to the feedback output voltage;
   a comparator, coupled to the reference transistor, for comparing the feedback output voltage to the target output voltage; and
   a gate charge pump, responsive to the comparator, for raising a gate voltage when the comparator determines that the feedback output voltage is below the target output voltage;
   wherein the gate voltage from the gate charge pump is applied to the gate of the reference transistor and to the gate of the translator transistor;
   whereby the feedback output voltage is raised by the gate charge pump when the comparator determines that the feedback output voltage is below the target output voltage.

2. The voltage translator circuit of claim 1 further comprising:
   a substrate pump, responsive to the comparator, for generating a substrate bias voltage, the substrate pump adjusting the substrate bias voltage when the comparator determines that the feedback output voltage is above the target output voltage;
   a substrate node for the translator transistor and a substrate node for the reference transistor each receiving the substrate bias voltage from the substrate pump;
   whereby the feedback output voltage is lowered by the substrate pump when the comparator determines that the feedback output voltage is above the target output voltage.

3. The voltage translator circuit of claim 2 wherein the substrate pump reduces the substrate bias voltage to a negative voltage below ground, the negative voltage below ground causing a transistor threshold voltage of the reference transistor and the translator transistor to increase;
   wherein a higher value of the transistor threshold voltage reduces the feedback output voltage,
   whereby the substrate pump increases the transistor threshold voltage to reduce the output voltage.

4. The voltage translator circuit of claim 3 wherein the translator transistor and the reference transistor are n-channel metal-oxide-semiconductor (MOS) transistors.

5. The voltage translator circuit of claim 4 further comprising:
   an enable input for receiving an enable signal, the enable signal indicating an enable mode when the translator transistor is to connect the signal input to the signal output and for indicating an isolate mode when the translator transistor is to isolate the signal input from the signal output;
   gating means, coupled to the comparator, for de-activating the gate charge pump when the enable signal indicates the isolate mode,
   whereby the gate charge pump is de-activated by the enable signal during isolate mode.

6. The voltage translator circuit of claim 5 wherein the gating means is further for de-activating the substrate pump when the enable signal indicates the isolate mode,
   whereby the substrate pump is de-activated by the enable signal during isolate mode.

7. The voltage translator circuit of claim 5 further comprising:
   a gate-voltage driver, coupled to the gate charge pump, for driving the gate voltage from the gate charge pump when the gate charge pump is activated, but for driving a disabling voltage onto the gate of the translator transistor when the enable signal indicates the isolate mode,
   whereby a disabling voltage is driven to the gate during the isolate mode.

8. The voltage translator circuit of claim 7 wherein the disabling voltage is ground.

9. The voltage translator circuit of claim 8 wherein the gate-voltage driver comprises:
   a pull-down transistor, activated during isolate mode, for connecting the gate to ground; and
   a coupling transistor, activated during the enable mode, for connecting an output of the gate charge pump to the gate.

10. The voltage translator circuit of claim 9 wherein the gate-voltage driver further comprises:
    a supply transistor, activated during the isolate mode by a control node, for precharging the output of the gate charge pump to a power-supply voltage;
    a control-node coupling transistor, activated during the enable mode, for applying the output of the gate charge pump to the control node of the supply transistor;
    a control-node pull-down transistor, activated during the isolate mode, for driving the control node to ground.

11. The voltage translator circuit of claim 10 wherein the pull-down transistor and the control-node pull-down transistor are n-channel transistors;
    wherein the coupling transistor, the supply transistor, and the control-node coupling transistor are each p-channel transistors having a well node connected to the output of the gate charge pump.

12. The voltage translator circuit of claim 2 wherein the reference input voltage and the target output voltage are constant voltages;

wherein the signal input is a dynamic input with the input voltage toggling high and low;

wherein the reference input voltage is substantially equal to a maximum voltage of the input voltage;

wherein the feedback output voltage is substantially equal to the output voltage when the maximum voltage is applied to the signal input, whereby voltage translation is set by constant voltages but a dynamic input is applied for voltage translation to the translator transistor.

13. A voltage translator integrated circuit comprising:

a translator transistor having a drain connected to an input voltage and a source producing an output voltage, the translator transistor having a control gate coupled to a gate node and a substrate connected to a substrate node;

a reference transistor having a drain connected to an input reference voltage and a source producing a feedback output voltage, the reference transistor having a control gate coupled to the gate node and a substrate connected to the substrate node;

a first comparator, receiving a target voltage, for comparing the target voltage to the feedback output voltage, the first comparator activating a substrate-oscillator-enable output when the feedback output voltage is above the target voltage;

a substrate oscillator that produces an substrate-oscillator output that oscillates when the substrate-oscillator-enable is activated, but does not oscillate when the substrate-oscillator-enable is not activated; and a substrate charge pump, receiving the substrate-oscillator output, for generating a bias voltage when the substrate-oscillator output is oscillating;

wherein the bias voltage is applied to the substrate node, the bias voltage adjusting a threshold voltage of the reference transistor and the translator transistor, reducing the feedback output voltage when the reference transistor is operating in saturation, whereby the reference transistor generates the feedback output voltage which is compared to the target voltage to enable the substrate oscillator, applying a pumped voltage to the substrate node.

14. The voltage translator integrated circuit of claim 13 further comprising:

a second comparator, receiving the target voltage, for comparing the target voltage to the feedback output voltage, the second comparator activating a gate-oscillator-enable output when the feedback output voltage is below the target voltage;

a gate oscillator that produces a gate-oscillator output that oscillates when the gate-oscillator-enable output is activated, but does not oscillate when the gate-oscillator-enable output is not activated;

a gate charge pump, receiving the gate-oscillator output, for generating a pumped voltage when the gate-oscillator output is oscillating; and a coupling transistor for applying the pumped voltage to the gate node, whereby the reference transistor generates the feedback output voltage which is compared to the target voltage to enable the gate oscillator, applying a pumped voltage to the gate node.

15. The voltage translator integrated circuit of claim 14 further comprising:

a supply transistor for applying a power-supply voltage to the gate node when the gate-oscillator output is not oscillating and the pumped voltage is not above the power-supply voltage;

wherein the supply transistor and the coupling transistor are p-channel transistors having substrate terminals connected to the pumped voltage.

16. The voltage translator integrated circuit of claim 15 further comprising:

an enable input for indicating an isolation mode when the translator transistor should isolate its source from its drain;

a pull-down transistor, coupled to the gate node, for driving the gate node to ground during the isolation mode;

wherein a control gate of the coupling transistor is driven with a high voltage to disable the coupling transistor when the enable input indicates the isolation mode, whereby the translator transistor is disabled during isolation mode.

17. The voltage translator integrated circuit of claim 16 wherein the target voltage is input to the voltage translator integrated circuit, whereby the target voltage is set by a user, the output voltage being user-programmable by setting of the target voltage.

18. The voltage translator integrated circuit of claim 17 wherein the pumped voltage is a voltage above a power-supply voltage when the gate charge pump is activated.

19. The voltage translator integrated circuit of claim 14 further comprising:

a plurality of translator transistors, each connected to a separate input and a separate output, but each connected to the gate node and to the substrate node, whereby the voltage translator integrated circuit translates many signals in parallel.

20. A voltage translator comprising:

translator transistor means, for translating an input voltage to an output voltage, the translator transistor means having a gate;

reference transistor means, for translating a reference input voltage to generate a feedback output voltage, the reference transistor means having a gate a target input receiving a target output voltage;

compare means, coupled to the reference transistor means, for comparing the feedback output voltage to the target output voltage;

gate charge pump means, responsive to the compare means, for raising a gate voltage when the compare means determines that the feedback output voltage is below the target output voltage;

wherein the gate voltage from the gate charge pump means is applied to the gate of the reference transistor means and to the gate of the translator transistor means;

substrate pump means, responsive to the compare means, for generating a substrate bias voltage, the substrate pump means adjusting the substrate bias voltage when the compare means determines that the feedback output voltage is above the target output voltage; and a substrate node for the translator transistor means and a substrate node for the reference transistor means each receiving the substrate bias voltage from the substrate pump means;

whereby the feedback output voltage is raised or lowered by the gate pumps means or the substrate pump means when the compare means determines that the feedback output voltage is not equal to the target output voltage.

* * * * *